(12) United States Patent
Sugiyama

(10) Patent No.: US 12,387,989 B2
(45) Date of Patent: Aug. 12, 2025

(54) SEMICONDUCTOR MODULE

(71) Applicant: FUJI ELECTRIC CO., LTD., Kawasaki (JP)

(72) Inventor: Takanori Sugiyama, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 525 days.

(21) Appl. No.: 17/390,295

(22) Filed: Jul. 30, 2021

(65) Prior Publication Data

US 2021/0358827 A1    Nov. 18, 2021

Related U.S. Application Data

(63) Continuation of application No. PCT/JP2020/024723, filed on Jun. 24, 2020.

(30) Foreign Application Priority Data

Aug. 6, 2019   (JP) .................... 2019-144576

(51) Int. Cl.
*H01L 23/053* (2006.01)
*H01L 23/057* (2006.01)
(Continued)

(52) U.S. Cl.
CPC .......... *H01L 23/057* (2013.01); *H01L 23/053* (2013.01); *H01L 23/32* (2013.01); *H05K 7/1427* (2013.01); *H05K 7/14329* (2022.08)

(58) Field of Classification Search
CPC ... H05K 7/1427; H01L 23/053; H01L 23/145; H01L 23/04; H01L 2924/181; H01L 2924/171; H01L 21/565
See application file for complete search history.

(56) References Cited

U.S. PATENT DOCUMENTS

2005/0202590 A1* 9/2005 Huang ............... H01L 21/6835
                                                            438/106
2014/0084452 A1* 3/2014 Nagamatsu ........ H01L 23/3735
                                                            361/728
(Continued)

FOREIGN PATENT DOCUMENTS

JP          2001036003 A      2/2001
JP          2003031735 A  *   1/2003
(Continued)

OTHER PUBLICATIONS

Translation of JP-2006316818-A (Year: 2006).*
(Continued)

*Primary Examiner* — Matthew C Landau
*Assistant Examiner* — Halee Cramer
(74) *Attorney, Agent, or Firm* — Rabin & Berdo, P.C.

(57) ABSTRACT

A semiconductor module includes a semiconductor element and a molded resin case having a sidewall portion surrounding the semiconductor element. The sidewall portion has an upper surface to which a printed board it to be attached. The sidewall portion has an attachment hole from the upper surface thereof in a depth direction orthogonal to the upper surface, through which a screw is inserted to attach the printed board. The attachment hole is integrally provided in the case. The attachment hole has a columnar shape as a whole, and the attachment hole has a tip portion having a hemispherical shape.

7 Claims, 5 Drawing Sheets

(51) Int. Cl.
*H01L 23/32* (2006.01)
*H05K 7/14* (2006.01)

(56) References Cited

U.S. PATENT DOCUMENTS

| | | | | |
|---|---|---|---|---|
| 2014/0376184 | A1* | 12/2014 | Gohara | H05K 7/20254 |
| | | | | 361/689 |
| 2016/0233146 | A1* | 8/2016 | Nakamura | H01L 23/4924 |
| 2018/0277397 | A1* | 9/2018 | Hashizume | H01L 23/49513 |
| 2019/0366601 | A1* | 12/2019 | Wittmann | B29C 45/16 |
| 2020/0378553 | A1* | 12/2020 | Oh | H02G 3/125 |
| 2021/0351094 | A1* | 11/2021 | Umemura | H05K 3/4605 |

FOREIGN PATENT DOCUMENTS

| | | | | |
|---|---|---|---|---|
| JP | 2006032392 | A | * | 2/2006 |
| JP | 2006316818 | A | * | 11/2006 |

OTHER PUBLICATIONS

Translation of JP2006032392A (Year: 2006).*
JP2003031735 Translation (Year: 2003).*
Chinese Office Action dated Apr. 19, 2024, in the counterpart Chinese patent application No. 202080012133.4.
Ou Xianglin, "Analysis and solution to common defects of screw columns", Collection of Technology Department, Oct. 21, 2015.

* cited by examiner

SEMICONDUCTOR MODULE

CROSS REFERENCE TO RELATED APPLICATIONS

This is a continuation application of International Application PCT/JP2020/024723 filed on Jun. 24, 2020 which claims priority from a Japanese Patent Application No. 2019-144576 filed on Aug. 6, 2019, the contents of which are incorporated herein by reference.

BACKGROUND OF THE INVENTION

Technical Field

The present invention relates to a semiconductor module including a semiconductor element.

Background Art

A semiconductor module has a substrate having thereon a semiconductor element such as an insulated gate bipolar transistor (IGBT), a power metal oxide semiconductor field effect transistor (MOSFET) and a free wheeling diode (FWD) and is utilized in, for example, an inverter apparatus. Such a semiconductor module includes a case for attaching a circuit substrate. The case is molded by resin molding such as injection molding. A melted resin is filled in a cavity space formed inside a die, and the resin is hardened to form a molded product. Attachment means for attaching a circuit substrate to the case of a semiconductor apparatus described above has been known in which screw seats of metallic columnar blocks are embedded (see Patent Literature 1, for example).

Prior Art Document

Patent Document

[Patent Document 1]
Japanese Patent Laid-Open No. 2001-36003

SUMMARY OF THE INVENTION

However, the case according to Patent Literature 1 requires metallic screw seats separately from the case, requiring part costs and time and labor for attaching the screw seats. As shown in FIG. 5, when an attachment hole 70 for attaching a printed board 4 with a tapping screw 18 is resin-molded integrally with a case 50, a corner 70b is formed at an end part 70a of the attachment hole. Thus, when the attachment hole 70 is formed integrally with the case 50 during resin molding of the case 50, the resin may be retained around the end part 70a of the attachment hole 70. Furthermore, when the resin molding is performed, an outer side of the case 50 is cooled first and an inner side thereof is cooled later. As a result, the case 50 is pulled because of the differential shrinkage between the outer side and inner side of the case 50. Therefore, a crack 81 or a vacant space (void) 82 may occur in a detail within the case 50.

When a crack 81 or a vacant space 82 occurs near the attachment hole 70 and if tapping is performed on the attachment hole 70 with the tapping screw 18, an insufficient strength occurs, and there is a possibility that the case is damaged when the tapping screw 18 is fastened. When a crack 81 or a vacant space 82 occurs near the attachment hole 70 and if tapping is performed on the attachment hole 70 with the tapping screw 18, there is a risk that a thread that is threaded decays with the tapping, torque loss occurs before a predetermined torque is acquired, and the tapping screw 18 turns free.

The present invention has been made in view of such a point, and it is one of objects of the present invention to provide a semiconductor module in which occurrence of a crack or a vacant space (void) during resin-molding of a case of the semiconductor module can be deterred.

According to one aspect, in a semiconductor module according to an embodiment including a semiconductor element, the semiconductor module has a case accommodating the semiconductor element, an attachment hole for attaching a printed board to an upper surface of the case with a screw is provided integrally with the case by resin molding, and the attachment hole has a columnar shape as a whole, and the attachment hole has a tip having a hemispherical shape.

According to the present invention, a semiconductor module can be provided in which occurrence of a crack and a vacant space (void) during resin molding of a case of a semiconductor apparatus can be deterred.

DESCRIPTION OF EMBODIMENTS

Figure 1:
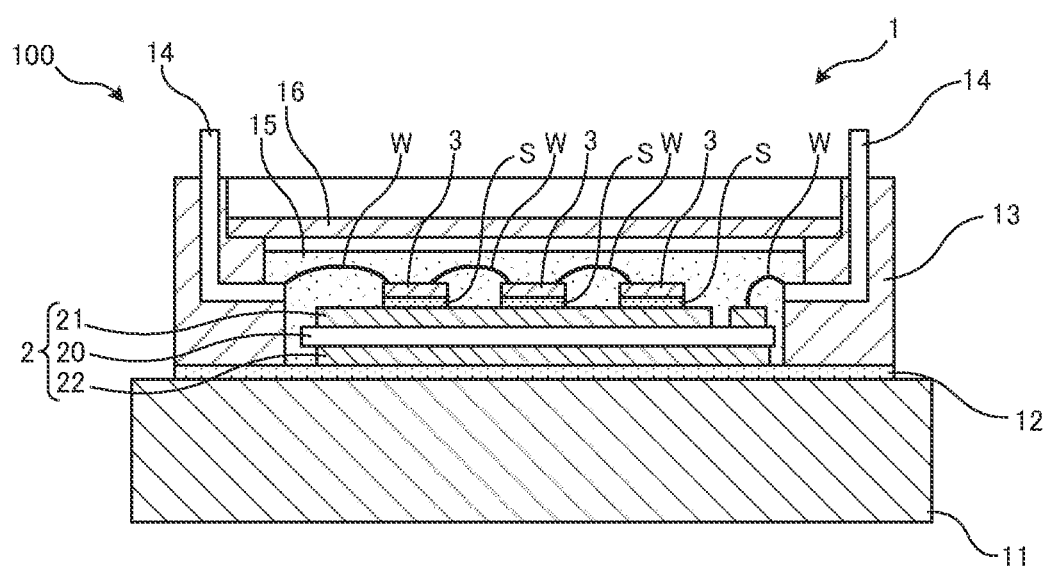
FIG. 1 is a schematic cross-sectional view showing an example of a semiconductor apparatus including a semiconductor module according to an embodiment.

A semiconductor apparatus to which the present invention is applicable is described below. FIG. 1 is a schematic cross-sectional view showing an example of a semiconductor apparatus 100 including a semiconductor module 1 according to an embodiment. The semiconductor apparatus to be described below is merely an example and is not limited thereto but can be changed as required. The expression "planar view" herein refers to a view of the semiconductor apparatus from a direction perpendicular to an insulating circuit substrate.

The semiconductor apparatus 100 is applied to a power converter such as a power module. As shown in FIG. 1, an insulating circuit substrate 2 is attached to the semiconductor module 1. The semiconductor module 1 includes a base plate 12 being a heat dissipation plate, a semiconductor element 3 disposed on an upper surface of the insulating circuit substrate 2, and a case 13 that surrounds a circumference of the insulating circuit substrate 2 and the semiconductor element 3. The insulating circuit substrate 2 is disposed on an upper surface of the base plate 12. The semiconductor module 1 is attached to an external apparatus 11 such as a cooler. A case 13, which constitutes a semiconductor module, has a printed board attached to the upper surface of the case 13. The printed board is described below. The case 13 has attachment holes for attaching the printed board with tapping screws. The attachment holes are explained with FIGS. 2-4 later. The tapping screws are explained with FIGS. 3 and 4 later.

The external apparatus 11 is configured by a cooler such as a heat sink, heat dissipation fins, and a water cooling jacket and has a square shape in planar view. The external apparatus 11 has an upper surface having a smooth bonding surface to which the semiconductor module 1 is bonded. The external apparatus 11 is formed of metal such as copper or aluminum or an alloy containing one kind or more of them, and, for example, plating processing is performed on the surface of the external apparatus 11. Having described the example in which, according to the embodiment, the external apparatus 11 is configured by a cooler, embodiments are not limited thereto. For example, the external apparatus 11 may be configured by a unit that is not shown.

The base plate 12 functions as a heat dissipation plate, is formed by performing plating processing on a surface of a metallic plate of, for example, copper, and has, for example, a rectangular shape in planar view. The base plate 12 has an upper surface having a smooth bonding surface to which the insulating circuit substrate 2 is bonded.

The insulating circuit substrate 2 is formed by stacking a metallic layer and an insulating layer and has a rectangular shape in planar view smaller than the upper surface of the base plate 12. More specifically, the insulating circuit substrate 2 has an insulating plate 20 having an upper surface (one surface) and a lower surface (another surface) on the opposite side of the upper surface, a first metallic layer 21 provided on the upper surface of the insulating plate 20, and a second metallic layer 2 provided on the lower surface of the insulating plate 20. The thicknesses of the insulating plate 20, the first metallic layer 21 and the second metallic layer 22 may be equal or may be different.

The insulating plate 20 is formed by an insulator of, for example, ceramic, and the first metallic layer 21 and the second metallic layer 22 are formed of, for example, a copper foil. The first metallic layer 21 configures a circuit layer electrically connected to a semiconductor element. The first metallic layer 21 has a flat surface and is formed by disposing a predetermined circuit pattern on the upper surface of the insulating plate 20. More specifically, an outer edge part of the first metallic layer 21 is positioned slightly inner than an outer edge part of the insulating plate 20.

The second metallic layer 22 has a flat surface and has a rectangular shape in planar view that covers the substantially entire lower surface of the insulating plate 20. More specifically, an outer edge part of the second metallic layer 22 is positioned slightly inner than the outer edge part of the insulating plate 20. The lower surface of the second metallic layer 22 of the insulating circuit substrate 2 is bonded to the upper surface of the base plate 12.

The insulating circuit substrate 2 configured as described above is formed by, for example, a direct copper bonding (DCB) substrate or an active metal brazing (AMB) substrate. The insulating plate 20 is formed by, for example, a ceramics material such as alumina ($Al_2O_3$), aluminum nitride (AlN) or silicon nitride ($Si_3N_4$). The insulating circuit substrate 2 is disposed at, for example, a center part of the upper surface of the base plate 12. [0019]

A semiconductor element 3 is disposed on the upper surface of the first metallic layer 21 of the insulating circuit substrate 2. The semiconductor element 3 is formed by a semiconductor substrate of, for example, silicon (Si) or silicon carbide (SiC). The semiconductor element 3 has, for example, a rectangular (square) shape in planar view. Three semiconductor elements 3 are disposed at a substantial center part on the first metallic layer 21. All of the semiconductor elements 3 are disposed on the first metallic layer 21 through a bonding material such as solder S. Thus, the semiconductor elements 3 are electrically connected to the first metallic layer 21. The number and positions of the semiconductor elements 3 are not limited thereto but can be changed as required.

As the semiconductor element 3, a switching element such as an insulated gate bipolar transistor (IGBT)and a power metal oxide semiconductor field effect transistor (MOSFET), or a diode such as a free wheeling diode (FWD) is used. Alternatively, as the semiconductor element 3, a reverse conducting (RC)—IGBT in which an IGBT and an FWD are integrated, a reverse blocking (RB)—IGBT having a sufficient resistance to pressure against a reverse bias or the like may be used.

The case 13 is a housing that accommodates the insulating circuit substrate 2 and the semiconductor elements 3. The case 13 is molded by a synthetic resin molded by injection molding and surrounds an outer circumferential side of the insulating circuit substrate 2. The case 13 and a lid part, which is described below, are formed of a thermoplastic resin. As such a resin, a PPS resin, a PBT resin, a PBS resin, a PA resin, an ABS resin or the like is available. A filler may be added to those resins as required. The case 13 has a lower surface that faces the upper surface of the base plate 12 and is bonded to the insulating circuit substrate 2 with a bonding material (adhesive) not shown.

The case 13 is disposed around the insulating circuit substrate 2 and the semiconductor element 3 and defines a space in which a sealing resin 15, which is described below, is filled. The case 13 has a square ring shape in planar view corresponding to the external shape of the base plate 12 and projects in a thickness direction (vertical direction) of the insulating circuit substrate 2. External terminals 14 are embedded in the sides that define the square ring shape of the case 13. Each of the external terminals 14 has an L shape in cross-sectional view and has one end projecting from an inner wall surface of the case 13 and another end projecting from the upper surface of the case 13. The external terminals 14 are integrated to the case 13 by, for example, insert molding. Details of the case 13 are described below.

The three semiconductor elements 3 are electrically connected by a wiring member W. Partial semiconductor elements 3 are electrically connected to the external terminals 14 on one side through a wiring member W described above. The external terminals 14 on the other hand are electrically connected to the first metallic layer 21 through a wiring member W.

A conductive wire is used for the wiring members W. The material of the conductive wire can be one or a combination of gold, copper, aluminum, a gold alloy, a copper alloy and an aluminum alloy. A member excluding the conductive wire can be used as the wiring members. For example, a ribbon or a lead frame can be used as the wiring members.

An internal space of the case 13, which is defined by the case 13, is sealed by the sealing resin 15. More specifically, the sealing resin 15 partially seals the insulating circuit substrate 2, the semiconductor elements 3, the wiring members W and the external terminals 14 in the inner side of the case 13. As the sealing resin 15, an epoxy resin or a silicone gel can be used. The sealing resin 15 is filled within the case 13 up to the height where the wiring members W described above are buried. After the sealing resin 15 is filled, a lid part 16 is attached above the sealing resin 15. The lid part 16 protects the inside of the case 13 by covering the upper part of the insulating circuit substrate 2 and the semiconductor elements 3.

Figure 2:
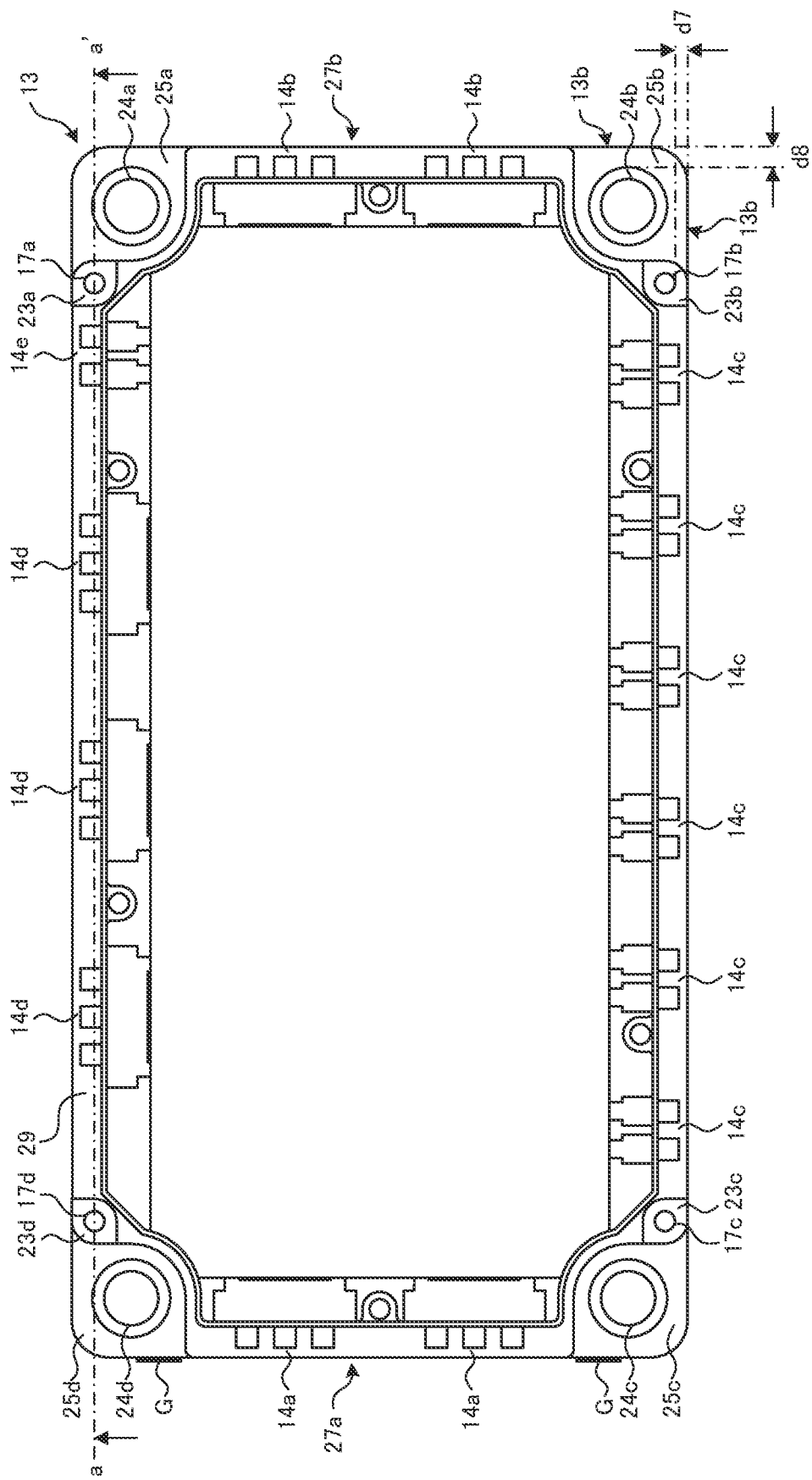
FIG. 2 is a plan view showing an example of a case of the semiconductor module according to the embodiment.
Figure 3:
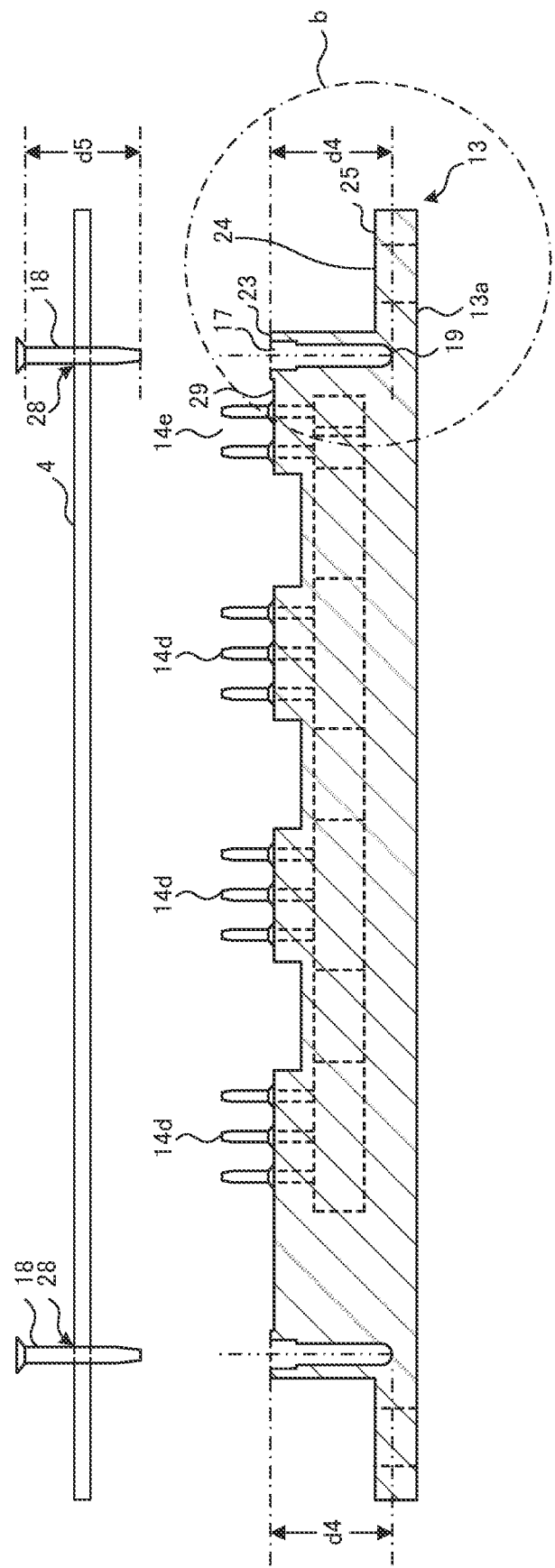
FIG. 3 is a cross-sectional view of the case shown in FIG. 2 taken at a line a-a' in a thickness direction viewed from a direction indicated by arrows.
Figure 4:
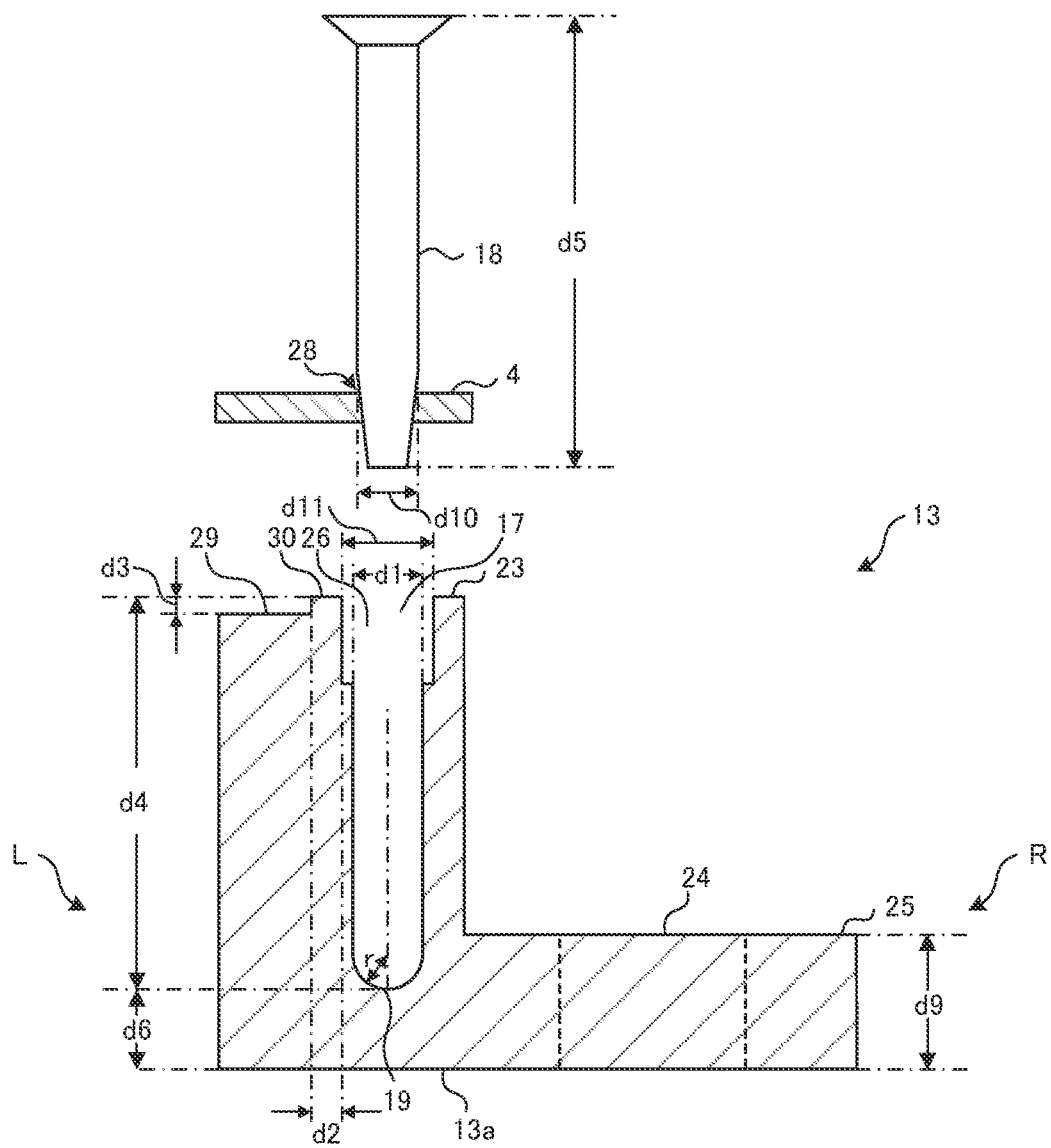
FIG. 4 shows an enlarged view of the cross-sectional view of an attachment hole shown in FIG. 3.

FIG. 2 is a plan view showing an example of the case 13 of the semiconductor module 1 according to the embodiment. FIG. 3 is a cross-sectional view of the case shown in FIG. 2 taken at a line a-a' in a thickness direction viewed from a direction indicated by arrows. FIG. 4 shows an enlarged view of the cross-sectional view of an attachment hole shown in FIG. 3.

Attachment holes 17a, 17b, 17c and 17d for attaching a printed board 4 with screws are provided in vicinity of corners of an outer edge of the case 13. The attachment holes 17a, 17b, 17c and 17d are provided at positions corresponding to through-holes 28 of the printed board 4. Hereinafter, the attachment holes 17a, 17b, 17c and 17d are called "attachment holes 17" when no particular distinction is required among them. The attachment holes 17 are integrated to the case 13.

The attachment holes 17 are provided as thread holes for tapping screws 18. The tapping screws 18 are fastened by the attachment holes 17 through the through-holes 28 of the printed board 4 so that the printed board 4 is fixed onto the case 13. Each of the attachment holes 17 has a columnar shape as a whole and has a circular shape in planar view. The column includes not only a shape having a bottom surface being a perfect circle but also a slightly tilted truncated cone. The inner part of the attachment hole 17 is not threaded and does not have a thread before the printed board 4 is attached with the tapping screws 18. A thread is not formed until the inner part of the attachment hole 17 is threaded by the tapping screw 18 to attach the printed board 4 with the tapping screws 18. Each of the attachment holes 17 has a diameter d1 equal to or larger than 1.0 mm and equal to or smaller than 5.0 mm. Preferably, the diameter d1 is equal to or larger than 2.0 mm and equal to or smaller than 3.0 mm.

Figure 5:
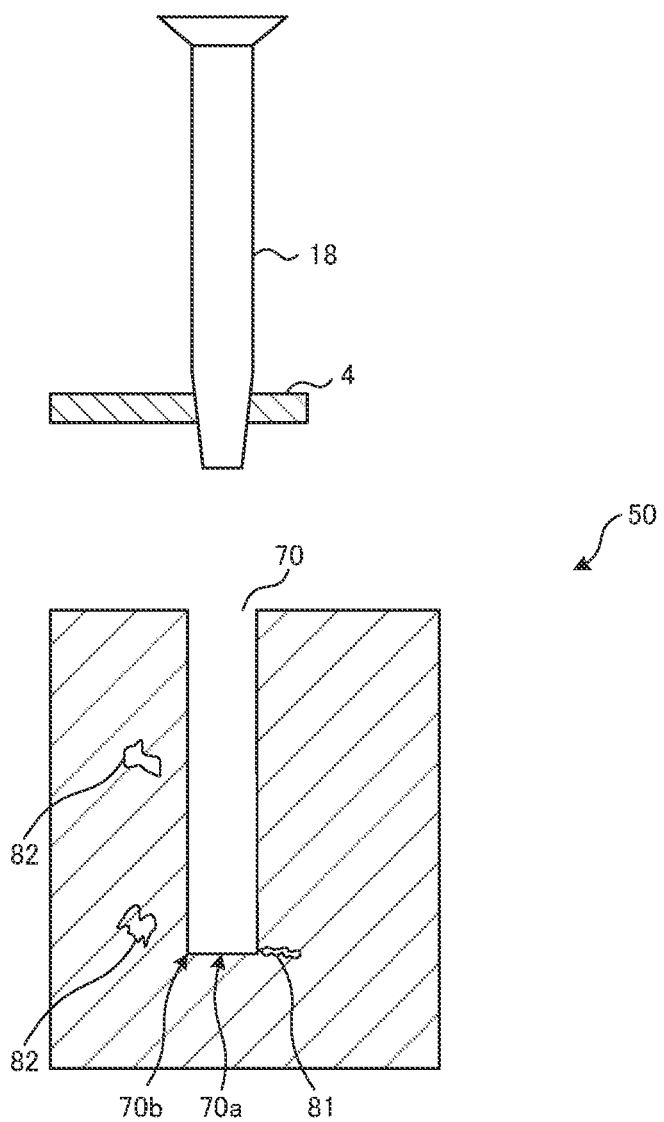
FIG. 5 shows an example of a conventional resin-molded case.

An end part 19 of each of the attachment holes 17 has a hemispherical shape. Preferably, the end part 19 has an R shape corresponding to a radius of the hole diameter. The hemispherical shape includes not only a shape cut at a plane extending through the center of a sphere but also a shape cut at a plane not extending through the center of a sphere. The sphere includes not only a shape of a perfect circle but also a shape of an ellipsoid. The expression "R shape corresponding to a radius of the hole diameter" refers to a space shape formed by a dimension of a radius r of the attachment hole 17 at each of the end parts 19 of the attachment holes 17. The dimension of the radius r of the attachment hole 17 is calculated based on the diameter d1 of the attachment hole 17. Thus, because a resin material flows smoothly along the rounded end parts 19 during resin molding even when the attachment holes 17 are integrally molded with the case 13, occurrence of a crack (see FIG. 5) and a vacant space (void) 82 (see FIG. 5) within the case 13 can be deterred. Furthermore, the rounded end part 19 can prevent concentration of stress to the end part 19, and occurrence of a crack 81 and a vacant space 82 within the case 13 can be deterred.

Also, occurrence of a crack 81 and a vacant space 82 particularly in vicinity of the attachment holes 17 can be deterred within the case 13. Thus, even when tapping is performed on the attachment holes 17 with the tapping screws 18, decay of threads threaded by the tapping due to an insufficient strength caused by the crack 81 or the vacant space 82 can be prevented. Therefore, occurrence of torque loss can be deterred, and free turn of the tapping screw 18 can be prevented. As a result, damaging the case 13 when the tapping screws 18 are fastened can be deterred.

The attachment holes 17a, 17b, 17c and 17d are arranged in attachment hole seats 23a, 23b, 23c and 23d, respectively. Hereinafter, the attachment hole seats 23a, 23b, 23c and 23d are called "attachment hole seats 23" when no particular distinction is required among them.

Each of the attachment hole seats 23 has a projection part 30 that projects upward with respect to a case upper surface 29 around the attachment hole seat 23. The projection part 30 has a peripheral dimension d2 equal to or larger than 0.5 mm and equal to or smaller than 4.0 mm surrounding the attachment hole 17. Preferably, the peripheral dimension d2 is equal to or larger than 1.0 mm and equal to or smaller than 2.0 mm. A height dimension d3 from the case upper surface 29 to the upper end of the projection part 30 is equal to or larger than 1.0 mm and equal to or smaller than 4.0 mm. Preferably, the height dimension d3 is equal to or larger than 1.5 mm and equal to or smaller than 2.0 mm. The lower surface of the printed board 4 is in contact with the upper surface of the projection part 30 provided in the attachment hole seat 23 so that the printed board 4 is fixed to the case 13.

As shown in FIG. 4, a length dimension d4 of the attachment hole 17 from the attachment hole seat 23, that is, the upper end of the projection part 30 to the end part 19 is longer than a length dimension d5 of the tapping screw 18. A thickness dimension d6 of the case 13 from the end part 19 of the attachment hole 17 to a lower end 13a of the case 13 is equal to or larger than a predetermined first dimension. For example, the thickness dimension d6 is equal to or larger than 1.0 mm and equal to or smaller than 6.00 mm. Preferably, the thickness dimension d6 is equal to or larger than 1.5 mm and equal to or smaller than 4.0 mm. Preferably, the thickness dimension d6 is equal to or larger than 2.0 mm and equal to or smaller than 3.0 mm.

Similarly, as shown in FIG. 2, a thickness dimension d7 of the case 13 from the attachment hole 17 to a side end 13b of the case 13 is equal to or larger than a predetermined second dimension. For example, the thickness dimension d7 is equal to or larger than 0.5 mm and equal to or smaller than 4.0 mm. Preferably, the thickness dimension d7 is equal to or larger than 0.5 mm and equal to or smaller than 2.0 mm. More preferably, the thickness dimension d7 is equal to or larger than 0.5 mm and equal to or smaller than 1.5 mm. Thus, retention of a resin in vicinity of the end part 19 of the attachment hole 17 during resin molding of the case 13 can be prevented, and occurrence of a crack 81 or a vacant space 82 in a detail within the case 13 can be deterred. Furthermore, the strength of the case 13 itself can be increased, and decay of the thread threaded by the tapping can be prevented. Therefore, occurrence of torque loss can be deterred, and free turn of the tapping screw 18 can be prevented. As a result, damaging the case 13 when the tapping screw 18 is fastened can be deterred.

The case 13 has, at its outer circumferential corners, apparatus hole seats 25 for attaching the external apparatus 11. The apparatus hole seats 25 have apparatus holes 24a, 24b, 24c and 24d. The apparatus holes 24a, 24b, 24c and 24d are used for attaching the case 13 to the external apparatus 11 by for example having bolts etc. (not illustrated) passing through themselves. Hereinafter, the apparatus holes 24a, 24b, 24c and 24d are called "apparatus holes 24" when no particular distinction is required among them. Connection members such as bolts are screwed to the external apparatus 11 through the apparatus holes 24a, 24b, 24c and 24d so that the external apparatus 11 is attached to the lower surface of the semiconductor module 1.

As shown in FIG. 2, a gate G of a die is provided at a position corresponding to one end 27a of the case 13. Preferably, gates G of the die are provided at positions corresponding to both sides of the one end 27a of the case 13, that is, at positions corresponding to apparatus hole seats 25c and 25d. The case 13 is resin-molded with a resin material injected through the gates G of the die. In this case, another end 27b of the case 13 has the attachment holes 17a and 17b. The one end 27a of the case 13 has the attachment holes 17c and 17d. When a resin material flows during the resin molding, the resin tends to flow uniformly all around the attachment holes 17c and 17d close to the gates G. On the other hand, the resin flows while catching the air in areas close to the attachment holes 17a and 17b far away from the gates G, and a vacant space or a void tends to easily occur. Even when the attachment holes 17a and 17b are provided far away from the gates G, because the resin material flows smoothly along the rounded end parts 19 during resin molding, occurrence of a vacant space or a void within the case 13 can be deterred. Furthermore, the gates G of the dieare provided at positions corresponding to both sides of the one end 27a of the case 13. Therefore, the resin material can flow smoothly toward the other end 27b linearly along the frame of the case 13, and occurrence of a vacant space or a void within the case 13 can be deterred.

The apparatus holes 24a, 24b, 24c and 24d are disposed in apparatus hole seats 25a, 25b, 25c and 25d. Hereinafter, the apparatus hole seats 25a, 25b, 25c and 25d are called "apparatus hole seats 25" when no particular distinction is required among them. As shown in FIG. 2, a thickness dimension d8 of the case 13 from each of the apparatus hole seats 25 to the side end 13b of the case 13 is equal to the thickness dimension d7 of the case 13 from the corresponding attachment hole 17 to the side end 13b of the case 13. As shown in FIG. 4, the lower end (end part) 19 of the attachment hole 17 is provided at a deeper position than an upper surface of the apparatus hole seat 25. As shown in FIG. 2, the attachment holes 17 are disposed inner than the apparatus hole seats 25 in the length direction of the case 13 in planar view. In other words, the apparatus hole seats 25 are disposed more closely to the end parts (one end 27a and the other end 27b) than the attachment holes 17 in the length direction of the case 13 in planar view.

A thickness dimension d9 of each of the apparatus hole seats 25 is larger than the thickness dimension d6 of the case 13 from the end part 19 of the attachment hole 17 to the lower end 13a of the case 13. The thickness dimension d9 of the apparatus hole seat 25 is equal to or larger than 2.0 mm and equal to or smaller than 8.0 mm. Preferably, the thickness dimension d9 is equal to or larger than 3.0 mm and equal to or smaller than 6.0 mm.

A situation is now described in which a gate G of a die is provided at a position corresponding to the apparatus hole seat 25 at the one end 27a of the case 13. First of all, a situation where a gate G is provided at a position corresponding to the right side R of the case 13 in FIG. 4 and a resin material flows from the gate G, that is, a situation where the attachment hole 17 is close to the gate G is described. The resin material flowing from the gate G passes through the apparatus hole seat 25 where the flow path through which the resin material flows is narrow and collides with the end part 19 of the attachment hole 17 at a high speed. Here, if the end part 19 of the attachment hole 17 is not rounded, the resin material collides with the end part 19 at a high speed, resulting in a turbulent flow of the resin material and easily causing a cavity. On the other hand, according to this embodiment, because a resin material flows from the gate G smoothly along the rounded end part 19, occurrence of a vacant space or a void can be deterred.

A situation where a gate G of a die is provided at a position corresponding to the left side L of the case 13 in FIG. 4 and a resin material flows from the gate G provided at the position corresponding to the left side L, that is, a situation where the attachment hole 17 is far away from the gate G is described. Because the attachment hole 17 is far away from the gate G, the viscosity of the resin increases while the resin material is flowing from the gate G to the attachment hole 17. Here, if the end part 19 of the attachment hole 17 is not rounded, the speed of the flow of the resin material further decreases in vicinity of the end part 19, and a vacant space or a void easily occurs in the subsequent apparatus hole seat 25. On the other hand, according to this embodiment, because a resin material flows smoothly along the rounded end part 19, the decrease of the resin speed can be suppressed, and occurrence of a vacant space or a void can be deterred.

As shown in FIG. 4, the inside diameter d1 of attachment hole 17 on the end part 19 side is slightly smaller than a diameter d10 of the tapping screw 18. An inside diameter d11 of an entrance 26 of the attachment hole 17 is wider than the inside diameter d1 of the attachment hole 17 on the end part 19 side. Thus, when the tapping screw 18 is inserted to the attachment hole 17, a worker can easily insert the tapping screw 18 to the attachment hole 17. Therefore, the working efficiency for producing the semiconductor module 1 can be increased.

As shown in FIG. 2, the external terminals 14 at least include a P(+) input terminal 14a, an N(−) input terminal 14b, a UVW output terminal 14c, a control terminal 14d for the semiconductor module 1, and an emitter terminal 14e for temperature sensing within the case 13. As shown in FIG. 2, the P(+) input terminal 14a is disposed at the one end 27a of the case 13, the N(−) input terminal 14b is disposed at the other end 27b of the case 13, the UVW output terminal 14c is disposed on the lower side of the case 13 in planar view, the control terminal 14d is disposed on the upper side of the case 13 in planar view, and the emitter terminal 14e is disposed at an upper right area of the case 13 in planar view. Each of the input terminal 14a, input terminal 14b, output terminal 14c, control terminal 14d and emitter terminal 14e included in the external terminals 14 has one end projecting from the inner wall surface of the case 13 and another end projecting from the upper surface of the case 13.

It should be noted that the present invention is not limited to the aforementioned embodiment, but various changes can be made thereto. The sizes, shapes and functions of the constituent elements shown in the attached drawings according to the aforementioned embodiment are not limited thereto but can be changed as required without departing from the scope that the effect of the present invention is exerted. In addition, changes can be made thereto without departing from the scope of the object of the present invention.

Having described that four attachment holes 17 are molded in the semiconductor module 1 according to the aforementioned embodiment, at least one attachment hole 17 may be molded, without limiting thereto. Although the apparatus holes 24 are resin-molded integrally with the case 13 in the semiconductor module 1 according to the aforementioned embodiment, the apparatus holes 24 may be molded in a separate body from the case 13.

INDUSTRIAL APPLICABILITY

As described above, the present invention has the effect that occurrence of a crack or a vacant space during resin molding of a case of a semiconductor module can be deterred and is particularly useful for a method for manufacturing a semiconductor module.

The subject application is based on Japanese Patent Application No. 2019-144576 filed Aug. 6, 2019, the entirety of which is incorporated herein.

What is claimed is:

1. A semiconductor module, comprising:
    a semiconductor element; and
    a molded resin case having a sidewall portion surrounding the semiconductor element, the sidewall portion having an upper surface and a lower surface opposite to each other in a depth direction, a printed board being attachable to the upper surface, the sidewall portion having an attachment hole extending from the upper surface thereof in the depth direction and does not reach the lower surface thereof so as to have a tip portion at a bottom thereof within the case, a screw being insertable into the attachment hole to attach the printed board to the case, the attachment hole being integrally provided in the case, wherein
    the attachment hole has a columnar shape as a whole, and the tip portion has a hemispherical shape such that a resin material of the case is flowable along an outer surface of the tip portion,
    a shortest distance from an edge of the attachment hole to an end of the sidewall portion of the molded resin case in a plan view of the semiconductor module is equal to or less than a prescribed value, and
    a thickness in the depth direction of the case from the bottom of the attachment hole to the lower surface of the case is in a range of 1.0 mm to 6.0 mm.

2. The semiconductor module according to claim 1, wherein the attachment hole is a screw hole for a tapping screw.

3. The semiconductor module according to claim 2, wherein a length of the attachment hole is longer than a length of the tapping screw.

4. The semiconductor module according to claim 1, wherein
    the case has a rectangular shape in a plan view of the semiconductor module, and the sidewall forms four sides of the case,
    one side of the four sides formed by the sidewall has a trace indicating that an injection of a resin material has been made, and
    the attachment hole is disposed at another side of the four sides formed by the sidewall that faces the one side.

5. The semiconductor module according to claim 1, wherein
    the sidewall of the case has an apparatus hole seat having an apparatus hole for attaching an external apparatus,
    a bottom of the tip portion of the attachment hole is located at a position lower from the upper surface of the sidewall of the case in the depth direction than is a position of a surface of the apparatus hole seat that is parallel to the upper surface of the sidewall portion of the case.

6. The semiconductor module according to claim 1, further comprising the printed board attached to the case through the attachment hole with a tapping screw.

7. The semiconductor module according to claim 1, wherein the shortest distance from the edge of the attachment hole to the end of the sidewall portion of the molded resin case in the plan view in a range of 0.5 mm to 4 mm.

* * * * *